(12) United States Patent
Lee et al.

(10) Patent No.: US 6,611,431 B1
(45) Date of Patent: Aug. 26, 2003

(54) HEAT DISSIPATION ASSEMBLY

(75) Inventors: Tsung-Lung Lee, Tu-Chen (TW); Cheng-Tien Lai, Tu-Chen (TW); ZiLi Zhang, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/115,290

(22) Filed: Apr. 2, 2002

(30) Foreign Application Priority Data

Nov. 30, 2001 (CN) .......................................... 90220797

(51) Int. Cl.[7] ................................................. H05K 7/20
(52) U.S. Cl. ....................................... 361/719; 257/719
(58) Field of Search ........................ 361/687, 703–705, 361/709–712, 717–719, 720; 165/80.3, 185; 257/706, 707, 713, 718, 719, 726, 727; 174/16.3; 248/505, 510

(56) References Cited

U.S. PATENT DOCUMENTS

| | | | |
|---|---|---|---|
| 5,880,930 A | * 3/1999 | Wheaton ..................... | 361/690 |
| 5,901,039 A | * 5/1999 | Dehaine et al. ............. | 361/704 |
| 6,412,546 B1 | * 7/2002 | Lin et al. .................... | 165/80.3 |
| 6,480,388 B1 | * 11/2002 | Lee et al. .................... | 361/704 |
| 6,497,273 B1 | * 12/2002 | Horng et al. ............... | 165/80.3 |
| 6,515,860 B1 | * 2/2003 | Shih ........................... | 361/704 |

* cited by examiner

*Primary Examiner*—Gerald Tolin
(74) *Attorney, Agent, or Firm*—Wei Te Chung

(57) ABSTRACT

A heat dissipation assembly includes a heat sink (10), a backplate (30), a plurality of bolts (42) and springs (46), and a PCB (50). The PCB supports a chip (60) thereon and defines a plurality of through holes (52) around the chip. The backplate forms a plurality of posts (36) engaged in the through holes. A plurality of cavities (38) is defined in the post. The heat sink comprises a chassis (12) and defines a plurality of fixing holes (16) through the chassis. The bolts extend through the fixing holes of the heat sink and threadedly engaged in the cavities of the backplate to connect the heat sink to the printed circuit board. The springs are squeezed between the bolts and the chassis of the heat sink, for providing appropriate forces on the heat sink toward the chip.

16 Claims, 3 Drawing Sheets

HEAT DISSIPATION ASSEMBLY

BACKGROUND OF THE INVENTION

1. Field of the Invention

The present invention relates to heat dissipation assemblies for computers, and more particularly to a heat dissipation assembly which includes a heat sink and a backplate having a plurality of posts extending through a printed circuit board (PCB) to secure with the heat sink.

2. Description of Related Art

A computer central processing unit (CPU) is the core administrator of electrical signals in most contemporary personal computers. Continued development of CPUs has enabled them to perform more and more functions. Heat generated by CPUs has increased commensurately. Such heat can adversely affect the operational stability of computers. Measures must be taken to efficiently remove the heat from the CPU. Typically, a heat dissipation device having great heat conductivity is mounted on the CPU to remove heat therefrom. A clip is frequently used to firmly attach the heat dissipation device to the CPU, thus achieving greater efficiency of heat dissipation.

Recently developed apparatuses for attaching a heat dissipation device to a CPU include two popular means. In one such means, the heat dissipation device is placed onto a pair of retention modules. Clips engaged with the retention modules firmly attach the heat dissipation device to the CPU. Unfortunately, this attachment mechanism entails a complicated assembly procedure, and has high costs of components and assembly.

In the other such means, the heat dissipation device is directly secured by bolts onto a substrate on which the CPU is mounted. Screw holes are defined in a base of the heat dissipation device and in the substrate. The bolts are inserted into the screw holes of the heat dissipation device and the substrate. The heat dissipation device is thereby attached to the CPU. Unfortunately, the connection between the heat dissipation device and the substrate is fixed. Therefore, the forces acting on the heat dissipation device are not evenly distributed. The required precise positioning of the heat dissipation device cannot be attained. This results in the heat dissipation device not being in intimate contact with the CPU. Furthermore, the substrate and the CPU are prone to be deformed or damaged, during excessively driving the bolts.

SUMMARY OF THE INVENTION

Accordingly, an object of the present invention is to provide a heat dissipation assembly which allows a heat sink thereof to have intimate thermal contact with an integrated circuit (IC) chip.

Another object of the present invention is to provide a heat dissipation assembly which protects a printed circuit board supporting an IC chip thereon from being damaged when force is unintentionally exerted on a heat sink of the assembly that is in contact with the chip.

A further object of the present invention is to provide a heat dissipation assembly wherein fasteners of the assembly can be combined to the heat sink in advance.

In order to achieve the objects set out above, a heat dissipation assembly of the present invention comprises a heat sink, a backplate, a plurality of bolts and springs, and a PCB. The PCB supports a chip thereon and defines a plurality of through holes around the chip. The backplate forms a plurality of posts engaged in the through holes. A plurality of cavities is defined in the post. The heat sink comprises a chassis and defines a plurality of fixing holes through the chassis. The bolts extend through the fixing holes of the heat sink and threadedly engaged in the cavities of the backplate to connect the heat sink to the printed circuit board. The springs is squeezed between the bolts and the chassis of the heat sink, for providing appropriate forces on the heat sink toward the chip. In the present invention, the fasteners can be combined to the heat sink in advance by threaded engagement of the bolts with the fixing holes of the heat sink.

Other objects, advantages and novel features of the present invention will become more apparent from the following detailed description when taken in conjunction with the accompanying drawings.

DETAILED DESCRIPTION OF THE INVENTION

Figure 1:
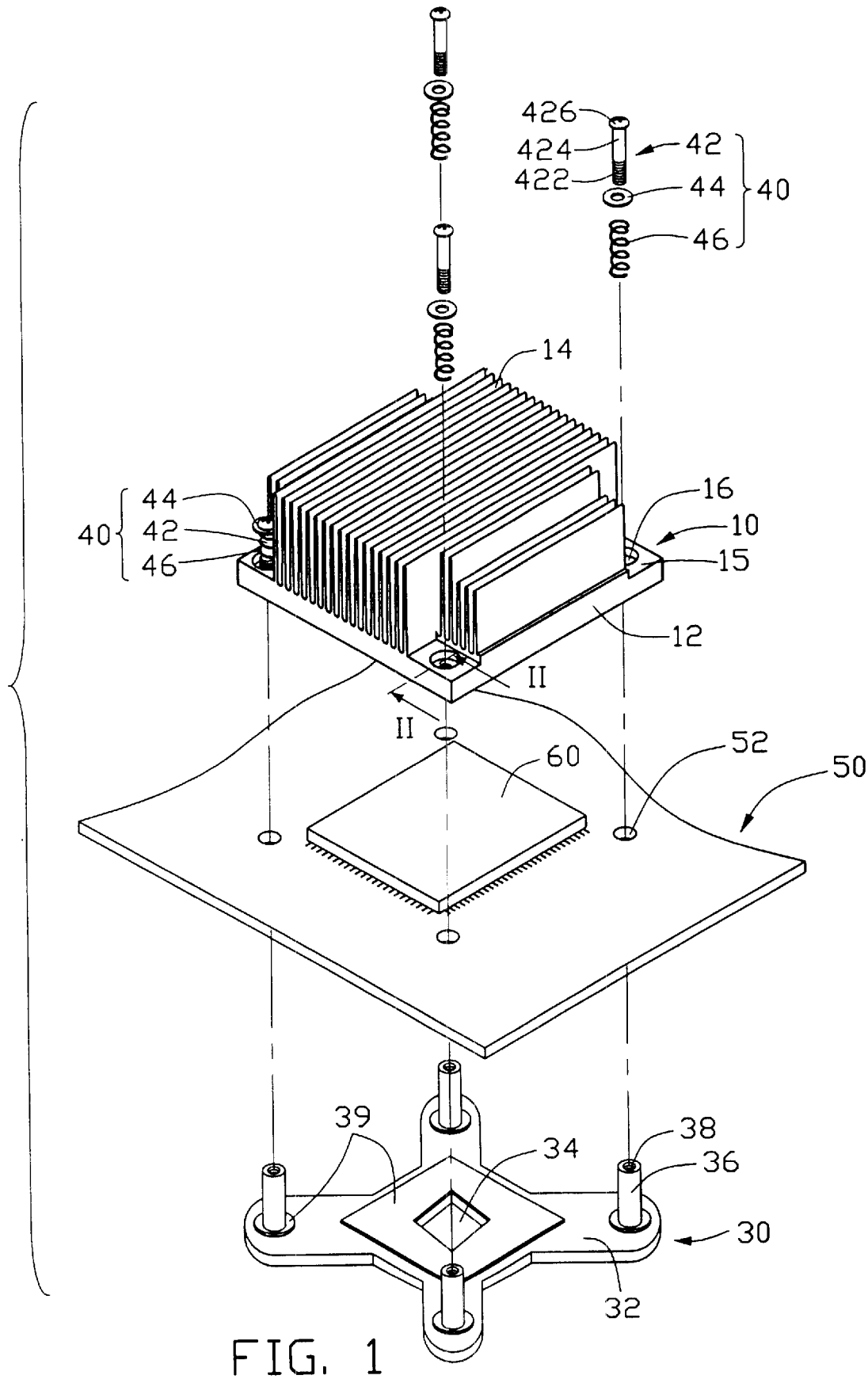
FIG. 1 is an exploded view of a heat dissipation assembly in accordance with the present invention.

Reference will now be made to the drawing figures to describe the preferred embodiment of the present invention in detail.

Referring to FIG. 1, a heat dissipation assembly in accordance with a preferred embodiment of the present invention comprises a heat sink 10, a backplate 30 and a plurality of fasteners 40. The heat dissipation assembly removes heat from an integrated circuit (IC) chip 60 mounted on a printed circuit board (PCB) 50. Four through holes 52 are defined in the PCB 50 respectively adjacent four corners of the chip 60.

Figure 2:
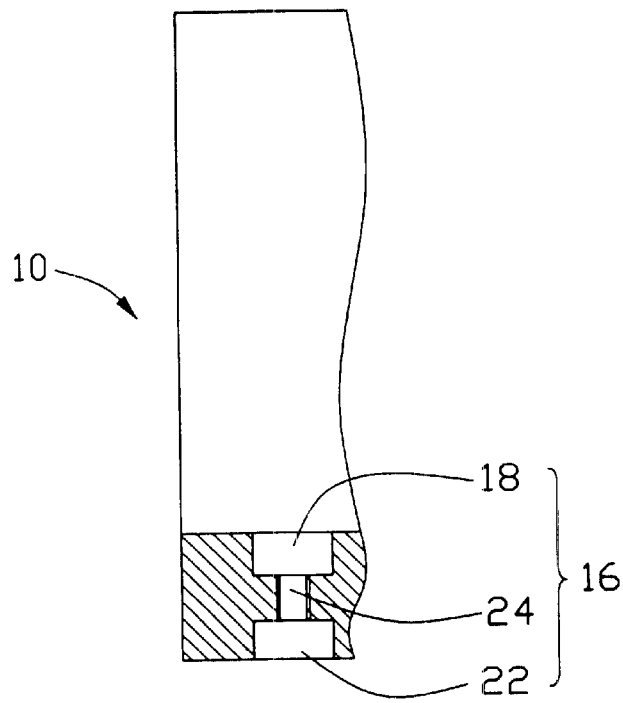
FIG. 2 is a cross-sectional view of a comer portion of a heat sink of the heat dissipation assembly of FIG. 1, taken along line II—II of FIG. 1.

Referring also to FIG. 2, the heat sink 10 comprises a rectangular chassis 12, and a plurality of fins 14 extending upwardly from the chassis 12. A corner portion 15 is defined at each of four corners of the heat sink 10. Each corner portion 15 does not have any fins 14 thereon. A fixing hole 16 is vertically defined through each corner portion 15. Each fixing hole 16 corresponds to a through hole 52 of the PCB 50. Each fixing hole 16 comprises an upper receiving portion 18, a central thread portion 24 below and in communication with the receiving portion 18, and a lower locating portion 22 below and in communication with the thread portion 24. A diameter of the thread portion 24 is less than a diameter of the receiving portion 18 and less than a diameter of the locating portion 22.

The backplate 30 comprises a cross-shaped base 32. An aperture 34 is defined in a central portion of the base 32. Four posts 36 extend upwardly from four respective distal ends of the base 32, for extending through the through holes 52 of the PCB 50 into the locating portions 22 of the fixing holes 16. Each post 36 defines a vertical cavity 38 having a fixed depth. A screw thread is formed in each post 36 at the cavity 38. Five pads 39 are fixed on the base 32, respectively around the posts 36 and the aperture 34, for protecting the PCB 50 from being damaged.

Each fastener 40 comprises a bolt 42, a washer 44 and a spring 46. Each bolt 42 comprises a thread section 422 adjoining a distal end thereof, an unthreaded section 424 at a center of the bolts 42, and a cap 426 at an opposite distal end of the bolt 42. A diameter of thread section 422 is slightly larger than that of the unthreaded section 424 of each bolt 42. The bolts 42 respectively extend through the washers 44 and the springs 46, to cause the thread sections 422 to be threadedly engaged with the thread portions 24 of the fixing holes 16 of the heat sink 10. Thereby, the fasteners 40 are secured to the heat sink 10. The bolts 42 can be further driven, to cause the thread sections 422 to be disengaged from the thread portions 24 of the heat sink 10 and to be threadedly engaged in the cavities 38 of the posts 36 of the backplate 30 (described in detail later).

Figure 3:
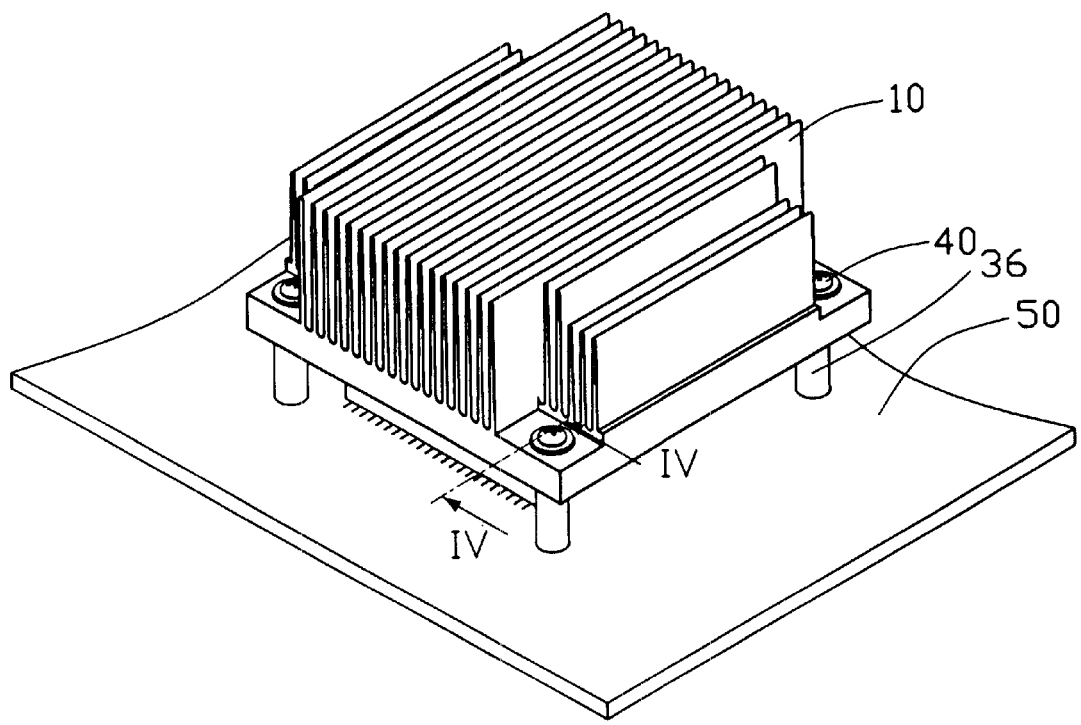
FIG. 3 is an assembled view of FIG. 1.
Figure 4:
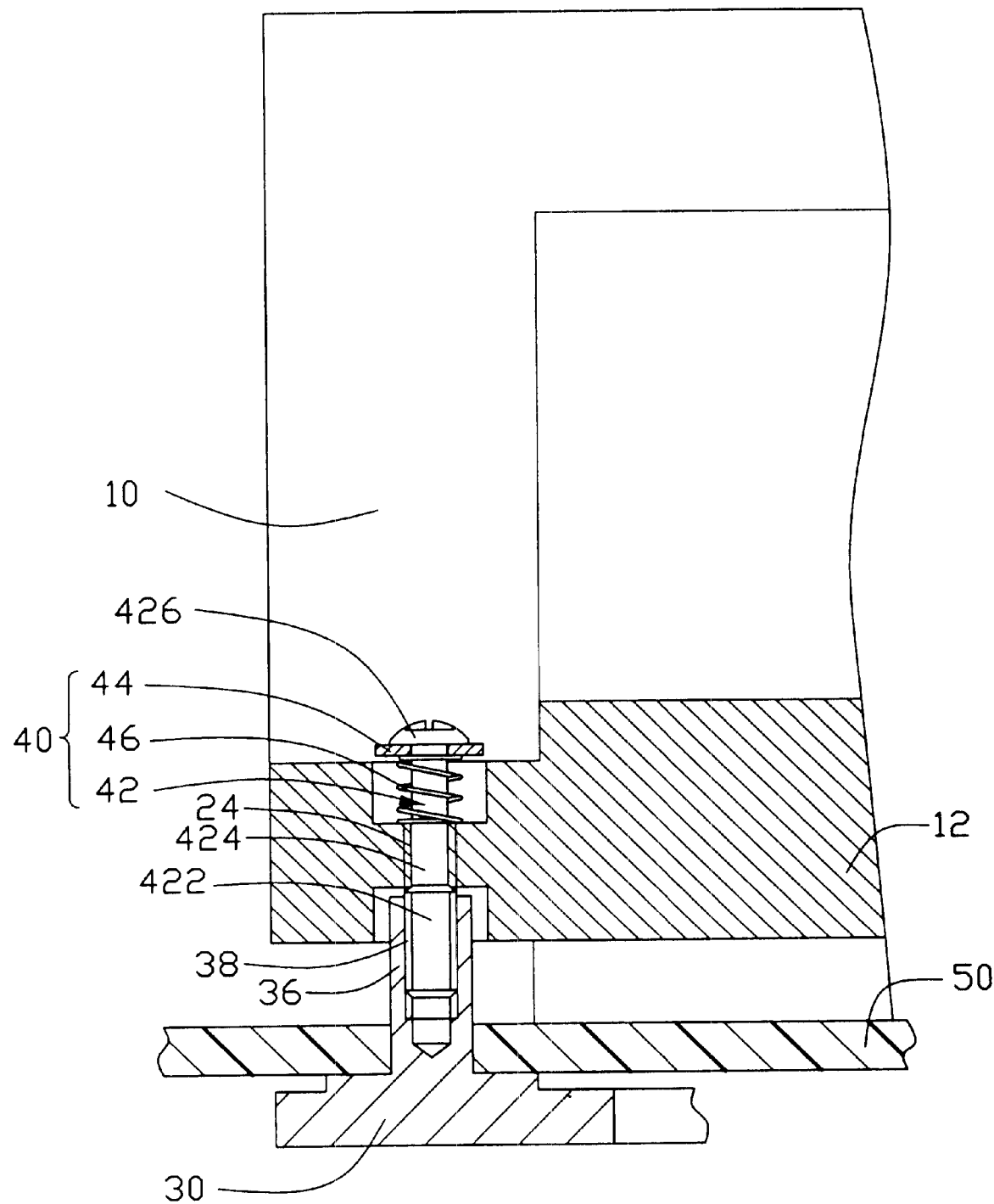
FIG. 4 is an enlarged view of a corner portion of the heat sink of the heat dissipation assembly of FIG. 3, taken along line VI—VI of FIG. 3.

Also referring to FIGS. 3 and 4, in assembly of the heat dissipation assembly, the springs 46 are partly received in the receiving portions 18 of the fixing holes 16 of the heat sink 10. The bolts 42 are extended in turn through the washers 44 and springs 46, and then threadedly engaged in the thread portions 24 of the fixing holes 16. The fasteners 40 are thereby secured to the heat sink 10.

The posts 36 of the backplate 30 are extended through the through holes 52 of the PCB 50. The combined heat sink 10 and fasteners 40 is placed on the chip 60 mounted on the PCB 50. The posts 36 of the backplate 30 are accommodated in the locating portions 22 of the fixing holes 16. The cavities 38 are respectively aligned with the thread portions 24 of the fixing holes 16. The bolts 42 are further driven to move downwardly. The thread sections 422 of the bolts 42 gradually escape from the thread portions 24 of the heat sink 10, and threadedly engage in the cavities 38, until the bolts 42 reach the fixed depth of the cavities 38 of the posts 36. The threaded engagement of the thread sections 422 of the bolts 42 with the cavities 28 provides connection of the heat sink to the PCB 50. The heat sink 10 is thereby secured to the PCB 50. In this position, the chassis 12 of the heat sink 10 is attached on the chip 60, without interaction with the posts 36 of the backplate 30. The thread sections 422 of the bolts fully escape from the thread portions 24 of the heat sink 10. The unthreaded sections 424 of the bolts 42 are partly received in the thread portions 24 of the heat sink 10 (see FIG. 4). The springs 46 encircling the unthreaded sections 424 are squeezed between the heat sink 10 and the washers 44, providing appropriate forces on the corner portions 15 of the heat sink 10 toward the chip 60. Thus, the heat sink 10 is intimately and evenly contacted with the chip 60.

In the present invention, the thread sections 422 of the bolts 42 can be threadedly engaged with the thread portions 24 of the fixing holes 16 of the heat sink 10, sandwiching the washers 44 and the springs 44 between the caps 426 of the bolts 42 and the chassis 12 of the heat sink 10. The fasteners 40 are thereby be pre-assembled to the heat sink 10. Thus, the bolts 42, the washers 44 and the bolts 46 of the fasteners 40 which are generally separate components, are all joined to the heat sink 10 in advance.

In addition, because each of the cavities 38 has a fixed depth, the bolts 42 can no longer be driven when they are fully engaged with the cavities 38. This prevents the PCB 50 and the chip 60 from being damaged when force is unintentionally exerted on the heat sink 10 that is in contact with the chip 60. The heat sink 10 is attached on the chip 60, without interaction with the posts 36 of the backplate 30. The forces exerted on the corner portions 15 of the heat sink 10 by the springs 46 are transferred from the heat sink 10 to the chip 60. Thus, the heat sink 10 is intimately attached on the chip 60. Due to adjustability of the springs 46, the forces exerted on the corners portions 15 are coordinated such that the heat sink 10 is in uniform contact with the chip 60. The heat sink 10 is thus able to efficiently remove heat from the chip 60 without risk of damage to the PCB 50 or the chip 60.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation assembly comprising:
   a printed circuit board supporting a chip thereon and defining a plurality of through holes around the chip;
   a backplate forming a plurality of posts received in the through holes of the printed circuit board, a plurality of cavities being defined in the posts, each of the cavities having a fixed depth;
   a heat sink comprising a chassis, and defining a plurality of fixing holes through chassis thereof;
   a plurality of bolts extending through the fixing holes of the heat sink and threadedly engaged in the cavities of the backplate to connect the heat sink to the printed circuit board; and
   a plurality of springs being squeezed between the bolts and the chassis of the heat sink, for providing appropriate forces on the heat sink toward the chip.

2. The heat dissipation assembly as recited in claim 1, wherein a plurality of fins extends upwardly from the heat sink chassis.

3. The heat dissipation assembly as recited in claim 2, wherein corner portions of the chassis do not have any fins, and the plurality of fixing holes is defined in the corner portions.

4. The heat dissipation assembly as recited in claim 1, wherein the chassis is rectangular, and the plurality of fixing holes is four fixing holes which are defined at four corners of the chassis.

5. The heat dissipation assembly as recited in claim 1, wherein each of the fixing holes comprises a thread portion and a locating portion below the thread portion.

6. The heat dissipation assembly as recited in claim 5, wherein a diameter of the thread portion is less than a diameter of the locating portion.

7. The heat dissipation assembly as recited in claim 5, wherein top portions of the posts are received in the locating portions of the fixing holes.

8. The heat dissipation assembly as recited in claim 1, wherein the backplate has a cross-shaped base, and the posts extend from respective distal ends of the base.

9. The heat dissipation assembly as recited in claim 1, wherein at least one pad is fixed on the backplate, for protecting the printed circuit board from being damaged.

10. A heat dissipation assembly comprising:
    a printed circuit board supporting a chip thereon and defining a plurality of through holes around the chip;
    a backplate forming a plurality of posts received in the through holes of the printed circuit board, a plurality of cavities being defined in the posts;
    a heat sink assembly comprising a heat sink attached on the chip, and a plurality of bolts and springs, the heat sink defining a plurality of fixing holes therein, the bolts threadedly engaged with the fixing holes, the springs sandwiched between the bolts and the heat sink;

the bolts being drivable to be unthreadedly engaged with the fixing holes and threadedly engaged with the cavities of the backplate, the heat sink being thereby secured to the printed circuit board, the heat sink being pressed by the springs to be in intimate and uniform contact with the chip.

11. The heat dissipation assembly as recited in claim 10, wherein each of the bolts comprising a thread section at a distal end thereof, an unthreaded section at a center thereof, and a cap at an opposite distal end thereof.

12. The heat dissipation assembly as recited in claim 10, wherein each of the cavities having a fixed depth.

13. The heat dissipation assembly as recited in claim 11, wherein a plurality of washers is provided between the caps of the bolts and springs.

14. The heat dissipation assembly as recited in claim 11, wherein a diameter of the thread section is a little larger than that of the unthreaded section.

15. A heat dissipation assembly comprising:
- a heat sink defining a plurality of fixing holes with inner threads therein;
- a plurality of bolts with associated springs thereon aligned with the corresponding fixing holes, each of said bolts including a lower threaded section and an upper unthreaded section;
- a chip located on one surface of a printed circuit board; wherein
- said heat sink is initially pre-assembled with the bolts and the springs, before said heat sink abuts against the chip, under a condition that the outer threaded sections of the bolts are engageably threaded with the inner threads of the corresponding fixing holes, respectively, with the corresponding springs in a more relaxed manner, while is finally assembled to an external device to have the heat sink tightly abut against the chip under a condition that the outer threaded sections of the bolts are engageably threaded with said external device and the unthreaded sections are freely received in the corresponding fixing holes, respectively, with the corresponding springs in a more stressed manner.

16. The assembly as recited in claim 15, wherein said external device abuts against the other surface of the printed circuit board in a direction toward said chip.

* * * * *